United States Patent [19]
Suematsu

[11] Patent Number: 5,712,602
[45] Date of Patent: Jan. 27, 1998

[54] PHASE-LOCKED OSCILLATOR FOR MICROWAVE/MILLIMETER-WAVE RANGES

[75] Inventor: Eiji Suematsu, Nara, Japan

[73] Assignee: Sharp Kabushiki Kaisha, Osaka, Japan

[21] Appl. No.: 679,679

[22] Filed: Jul. 9, 1996

[30] Foreign Application Priority Data

Jul. 31, 1995 [JP] Japan ................................. 7-194785

[51] Int. Cl.$^6$ ............................... H03C 3/09; H03L 7/16
[52] U.S. Cl. ................................. 332/127; 331/23; 331/25; 331/30
[58] Field of Search ......................... 331/23, 25, 30; 332/127

[56] References Cited

U.S. PATENT DOCUMENTS

| | | | |
|---|---|---|---|
| 4,426,627 | 1/1984 | Yoshisato et al. | 331/17 |
| 4,797,637 | 1/1989 | Kegasa et al. | 331/17 |
| 5,146,186 | 9/1992 | Vella | 331/16 |

FOREIGN PATENT DOCUMENTS 6-152243  5/1994  Japan .

*Primary Examiner*—Siegfried H. Grimm

[57] ABSTRACT

An VCO generates a high-frequency signal based on a modulating signal and a phase-locking control signal. A first distributor separates the high-frequency signal into two parts, one of which is outputted as an oscillator output signal. An n-multiplier and a microwave amplifier for n-multiplication adjust the level of the reference signal while the frequency of it is multiplied by 'n'. A second distributor separates the output from the microwave amplifier for n-multiplication into two parts, one of which is made to be a comparative signal, the other is made to be a locally oscillated signal. A frequency mixer and a microwave amplifier for frequency mixing produce an intermediate frequency signal using the other output from the first distributor and the locally generated signal. The phase comparator compares the intermediate frequency signal with the comparative signal to output an error signal. An LPF generates the phase-locking control signal by removing unwanted signals from the error signal.

6 Claims, 6 Drawing Sheets

PHASE-LOCKED OSCILLATOR FOR MICROWAVE/MILLIMETER-WAVE RANGES

BACKGROUND OF THE INVENTION

(1) Field of the Invention

The present invention relates to a phase-locked oscillator for microwave/millimeter-wave ranges, in particular relating to a microwave/millimeter wave phase locked oscillator which presents improved frequency stability with low phase noises in the high-frequency range.

(2) Description of the Prior Art

In recent years, with the augment of the amount of information to be handled, the communications using high-frequency waves such as microwaves and millimeter-waves have increasingly attracted a good deal of attention. Phase-locked oscillators for microwave/millimeter-wave ranges for use in the communications in the microwave and millimeter-wave ranges are required to have high frequency stability.

FIG. 1 is a block diagram showing an example of a conventional phase-locked oscillator for microwave/millimeter-wave ranges (Japanese Patent Application Laid-Open Hei 6 No. 152,243). In this figure, the circuit includes a voltage controlled oscillator (to be referred to hereinbelow as VCO) 1, a distributor 2, a frequency mixer 3, a divider 4, a reference signal source 5, a phase comparator 6, a low-pass filter (LPF) 7 and a local oscillator 8.

In this phase-locked oscillator, the output from VCO 1 is separated in two signals through distributor 2; one is used as an oscillator output signal, the other is used to produce a phase-locking control signal. In this circuit, since the operating frequency of the digital divider 4 is, in practice, about 12 GHz or lower, the distributor output (of frequency $f_c$) is down-converted into a signal with an operating frequency $f_{IF}$ of digital divider 4 (dividing ratio=d) by the combination of frequency mixer 3 and local oscillator (having an oscillating frequency $f_s$) 8. The thus obtained signal is further frequency converted ($f_{div}=(f_c-f_s)/d$) by digital divider 4 to meet the frequency $f_r$ of reference signal source 5. Then, this signal and the signal of frequency $f_r$ from reference signal source 5 are inputted to phase comparator 6. This phase comparator 6 compares the phases of the two signals to output an error signal. This error signal is processed through LPF 7 where unwanted signals are removed, and is inputted to VCO 1 as the phase-locking control signal. In this way, the frequency can be stabilized.

Although the configuration shown in FIG. 1 uses digital divider 4, in place of this, it is also possible to directly down-convert the frequency of the output from distributor 2 into the frequency of reference signal source 5 by means of the frequency mixer 3, so that the obtained signal $f_{IF}$ and the reference signal $f_r$ may be inputted to phase comparator 6.

However, in either of the above phase-locked oscillators, a local oscillator 8 presenting excellent frequency stability in the high-frequency range is needed. This makes the device complicated and expensive.

There is another known circuit which uses an analog divider 10 as the frequency dividing means, as shown in FIG. 2.

In this circuit, a part of the output signal having a frequency of $f_c/2$ from a frequency mixer 3 is fed back to the locally oscillated signal input terminal of the frequency mixer by way of an amplifier 9, forming a feedback loop. Hence, random noise inside the feedback loop will be amplified by the amplifier 9 so that the level of noise at the frequency of $f_c/2$ will become high. Frequency mixer 3 mixes a signal $f_c$ from VCO 1 and the signal of $f_c/2$ (the output from amplifier 9) to produce a signal involving frequency components of $f_c$, $f_c \pm f_c/2$ at the output terminal from frequency mixer 3. Of these, the frequency component $f_c/2$ is re-amplified through amplifier 9 so as to be fed back to the locally oscillated signal input terminal to frequency mixer 3. As this process is repeated, the signal of frequency of $f_c/2$ will develop in the feedback loop, whereby two-divided component $f_c/2$ of the oscillating frequency wave ($f_c$) of VCO 1 can be obtained in its steady state. In this case, noise components deviated from the frequency of $f_c/2$ will fall outside the transmission range of the amplifier by the repetition of the above process, thus only the frequency component $f_c/2$ can remain.

In the above configuration of FIG. 2, the signal is divided in two by frequency mixer 3 in the analog manner and the resultant signal with a reduced frequency is inputted into the normal digital divider 4. Accordingly, there is no need to use a local oscillator with high frequency stability as was needed in the conventional configuration of FIG. 1.

However, in the above configuration of FIG. 2, the dividing ratio of the analog-type divider (designated at 10) is as small as ½. Therefore, when the fact that the operating frequency of digital divider 4 is about 12 GHz or less is considered, it is very difficult to use the configuration of FIG. 2 for the millimeter-wave range in which the frequency of the output from distributor 2 or oscillator output signal is over 30 GHz.

Further, since the signal inputted to frequency mixer 3 in the feedback loop, directly uses the signal containing random noise which has been developed inside the feedback loop, the signal tends to present a degraded purity with a considerable amount of phase noise. Accordingly, a large amount of noise is added in frequency mixer 3, whereby the influence of the noise inside the phase-locked loop 20 is increased and therefore would greatly affect the phase noise in VCO 1.

SUMMARY OF THE INVENTION

The present invention has been achieved to solve the above problems, and it is therefore an object of the present invention to provide a phase-locked oscillator for microwave/millimeter-wave ranges which presents excellent frequency stability with low phase noise in the high-frequency range.

In order to attain the above object, the gist of the invention can be described as follows:

First, a phase-locked oscillator for microwave/millimeter-wave ranges in accordance with the first aspect of the invention includes: an oscillating means for producing a high-frequency signal based on a modulating signal and a phase-locking control signal; a first distributing means for distributing the high-frequency signal into two parts and outputting one part of it as an oscillator output signal; an n-multiplying means for multiplying the frequency of a reference signal by 'n'; a second distributing means for distributing the output from the n-multiplying means into two parts and outputting one part of it as a comparative signal and the other as a locally oscillated signal; a frequency mixing means for producing an intermediate frequency signal using the other output from the first distributing means and the locally oscillated signal; a phase comparing means for comparing the intermediate frequency signal and the comparative signal to output an error signal; and a low-pass filtering means for removing unwanted signals from the error signal to produce the phase-locking controlling signal.

In the above configuration, the frequency of the reference signal is multiplied by 'n' by the n-multiplying means to produce a comparative signal and a locally oscillated signal. The frequency mixing means produces an intermediate frequency signal using the locally oscillated signal and a signal which has been distributed from the output from the oscillating means by the first distributing means. Then the phase comparing means compares the intermediate frequency signal with the comparative signal. By this method, it is possible to stabilize the comparative signal and the locally oscillated signal to the same degree as the stability of the reference signal. In consequence, the frequency stability of the oscillator output signal from the oscillating means can be improved to the same degree as that of the reference signal, whereby it is possible to inhibit phase-noise.

Next, a phase-locked oscillator for microwave/millimeter-wave ranges in accordance with the second aspect of the invention includes: an oscillating means for producing a high-frequency signal based on a modulating signal and a phase-locking control signal; a first distributing means for distributing the high-frequency signal into two parts and outputting one part of it as an oscillator output signal; a second distributing means for distributing a reference signal into two parts; an n-multiplying means for multiplying the frequency of one output from the second distributing means by 'n' to produce a comparative signal; an m-multiplying means for multiplying the frequency of the other output from the second distributing means by 'm' to produce a locally oscillated signal; a frequency mixing means for producing an intermediate frequency signal using the other output from the first distributing means and the locally oscillated signal; a phase comparing means for comparing the intermediate frequency signal and the comparative signal to output an error signal; and a low-pass filtering means for removing unwanted signals from the error signal to produce the phase-locking controlling signal.

In the above configuration, the n-multiplying means produces a comparative signal from a signal which has been obtained by distributing the reference signal in two parts. The m-multiplying means produces a locally generating signal from the other signal which has been distributed in two parts. Then, the frequency mixing means produces an intermediate frequency signal using the locally oscillated signal and a signal which has been distributed from the output from the oscillating means by the first distributor. Then the phase comparing means compares the intermediate frequency signal with the comparative signal. By this method, it is possible to stabilize the comparative signal and the locally oscillated signal to the same degree as the stability of the reference signal. In consequence, the frequency stability of the oscillator output signal from the oscillating means can be improved to the same degree as that of the reference signal, whereby it is possible to inhibit phase-noise.

Next, a phase-locked oscillator for microwave/millimeter-wave ranges in accordance with the third aspect of the invention is that in the phase-locked oscillator for microwave/millimeter-wave ranges according to the above second configuration, the frequency mixing means includes a higher-harmonic mixing means for generating a higher harmonic of the locally oscillated signal.

This phase-locked oscillator for microwave/millimeter-wave ranges causes the higher-harmonic mixing means to produce the k-th order harmonic of the locally oscillated signal. Therefore, it is possible to reduce the multiplying factor 'm' in the m-multiplier to 1/k times that of the above second configuration. Accordingly, it is possible to lower the conversion loss in the m-multiplying means. Thus, when an amplifier is used based on the heterodyne scheme, it is possible to improve the C/N ratio of the oscillator output signal and the phase-noise characteristic.

Further, a phase-locked oscillator for microwave/millimeter-wave ranges in accordance with any one of the fourth through sixth aspects of the invention, is that in the phase-locked oscillator for microwave/millimeter-wave ranges according to any one of the above first to the third configurations of the invention, the oscillating means includes a higher-harmonic oscillating means for generating a fundamental wave signal and a higher harmonic of the fundamental signal, and the first distributing means includes a wave-component separating means for separating the fundamental wave signal and the higher-harmonic signal from one another and outputting the higher-harmonic signal as the oscillator output signal.

In the above phase-locked oscillator for microwave/millimeter-wave ranges, the oscillating means written in any of the above first through third configurations, is made up of a microwave semiconductor etc., for generating the h-th order harmonic, and the first distributing means is made up of a wave-component separator for separating the fundamental wave signal and the h-th order harmonic from one another. Accordingly, when the same oscillator output frequency with that in the phase-locked oscillator for microwave/millimeter-wave ranges of any of the first through third configurations of the invention is to be obtained, it is possible to reduce the multiplying factors 'n' and 'm' of the n-multiplying means and the m-multiplying means to 1/h times those of the corresponding configuration. In consequence, it is possible to reduce the conversion losses in the n-multiplying means and the m-multiplying means, and thus it is possible to reduce the phase noise. Further, the operating frequencies of the other elements such as the frequency mixing means, the phase comparing means etc., can be lowered, so that it is possible to simplify the circuit configuration.

DESCRIPTION OF THE PREFERRED EMBODIMENTS

Embodiments of the invention will hereinafter be described with reference to the accompanying drawings.

(First embodiment)

Figure 1:
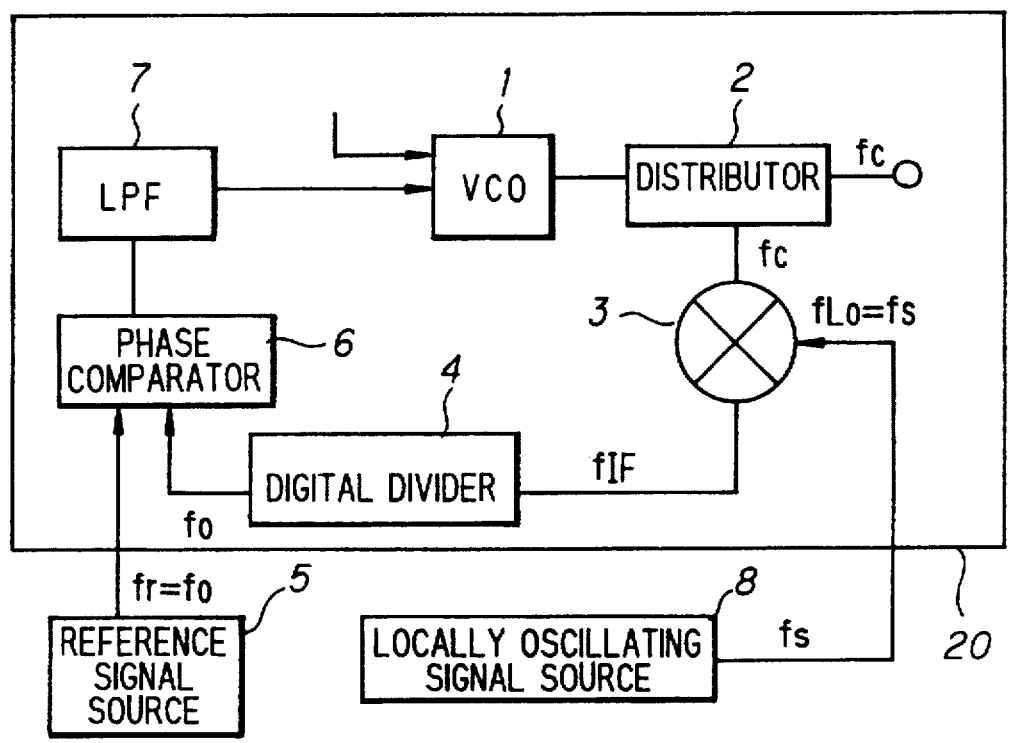
FIG. 1 is a block diagram showing a configuration of a conventional phase-locked oscillator for microwave/millimeter-wave ranges.
Figure 2:
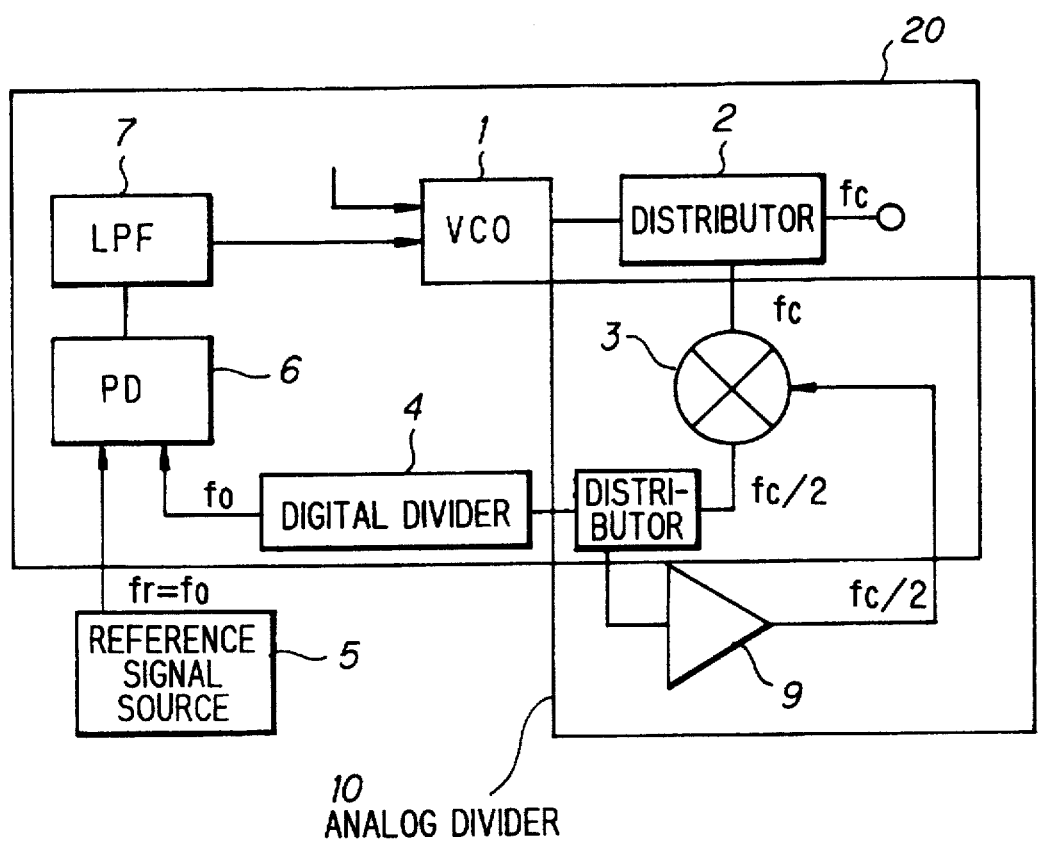
FIG. 2 is a block diagram showing another configuration of a conventional phase-locked oscillator for microwave/millimeter-wave ranges.
Figure 3:
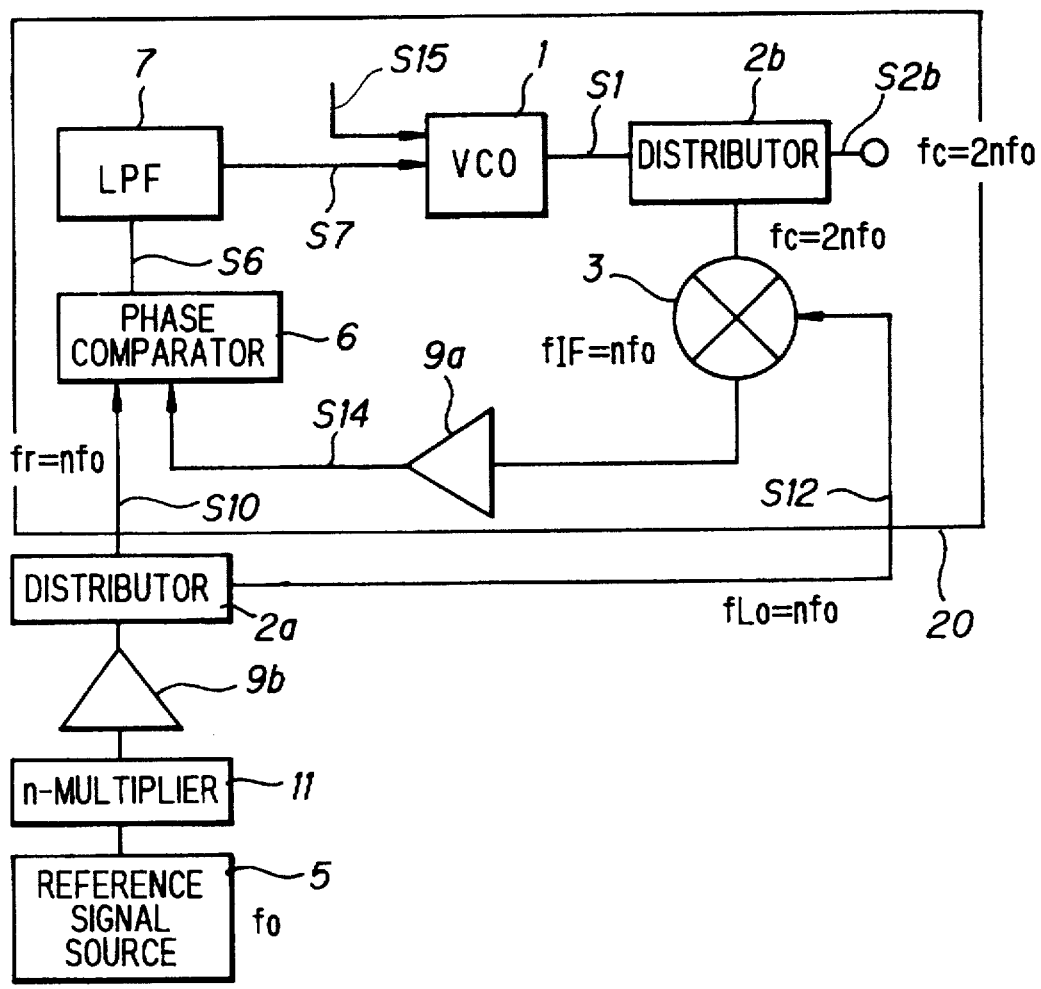
FIG. 3 is a block diagram showing a configuration of a phase-locked oscillator for microwave/millimeter-wave ranges in accordance with the first embodiment of the invention.

FIG. 3 is a structural view showing the first embodiment. In FIG. 3, the same components as used in FIGS. 1 and 2 are designated with the corresponding reference numerals. As shown in the figure, the first embodiment includes: an oscillating means (VCO) 1; a first distributing means (distributor) 2b; a frequency mixing means (a mixer 3 and a microwave amplifier 9a); a reference signal source 5; an n-multiplying means (an n-multiplier 11 and a microwave amplifier 9b); a second distributing means (distributor) 2a; a phase comparing means (phase comparator) 6; a low-pass filtering means (low-pass filter (LPF)) 7.

Here, n-multiplier 11 as well as frequency mixer 3 has a band-pass filter in order to sufficiently inhibit unwanted higher harmonics, image signals, spurious signals. Microwave amplifiers 9a and 9b are gain-variable, linear, low-noise amplifiers which present narrow-band characteristics so as to compensate the conversion losses in n-multiplier 11, frequency mixer 3, phase comparator 6 etc., and to lower the noise to be generated in the appliance which is connected next to it. The amplifiers are further to reduce the spurious signal and adjust the levels of input to frequency mixer 3 and phase comparator 6.

Now, the operation of this phase-locked oscillator for microwave/millimeter-wave ranges will be described. Here, it is assumed that the multiplying factor of n-multiplier 11 is 16, and the frequency of the reference signal is 2 GHz. Microwave amplifiers 9a and 9b are assumed to be gain-variable, linear, low-noise amplifiers having narrow-band characteristics of 32 ±1 GHz.

The VCO 1 receives a phase-locking control signal s7 and a modulating signal s15 to output a high-frequency signal s1 having an oscillating frequency $f_c$ ($=2nf_o=64$ GHz), to distributor 2b. This distributor 2b separates the high-frequency signal s1 into two parts; one is outputted as an oscillator output signal s2b of frequency $f_c$ ($=2nf_o=64$ GHz), the other is fed back to produce a phase-locking control signal s7.

The reference signal having a frequency $f_o(=2$ GHz) from reference signal source 5 is inputted to n-multiplier 11 where the frequency of the input signal is multiplied by 16. The signal from n-multiplier 11 (having a frequency of $nf_o$ (=32 GHz)) is amplified by microwave amplifier 9b. Then, the signal is separated into two part through distributor 2a.

One signal s12 of the signals which have been distributed from the distributor 2a is inputted as a local-oscillation signal having a frequency $fL_o$ ($=nf_o=32$ GHz) to the local-oscillation signal input terminal of the frequency mixer 3, where the input signal is mixed with the signal having a frequency $f_c$ ($=2nf_o=64$ GHz) from distributor 2b and the resultant signal is amplified by microwave amplifier 9a to be outputted as intermediate frequency signal s14 having a frequency $f_{IF}$ ($=nf_o=32$ GHz), which is then inputted to phase comparator 6. The other signal designated at s10 having a frequency $f_r$ ($=nf_o=32$ GHz) is inputted to phase comparator 6 as a comparative signal.

Phase comparator 6 compares the two signals s10 and s14 to output an error signal s6. This error signal s6 is processed through LPF 7 where unwanted signals are removed, to thereby produce a phase-locking control signal s7 to be inputted to VCO 1.

The thus configured loop 20, by feeding the output from VCO 1 back, reduces the error signal s6 to zero. As a result, even if VCO 1 outputs a high-frequency wave having an oscillating frequency $f_c$, which belongs to the millimeter-wave range, it is possible to stabilize the frequency so that the frequency stability and the phase-noise characteristic can be made close to those of reference signal source 5.

(Second embodiment)

Figure 4:
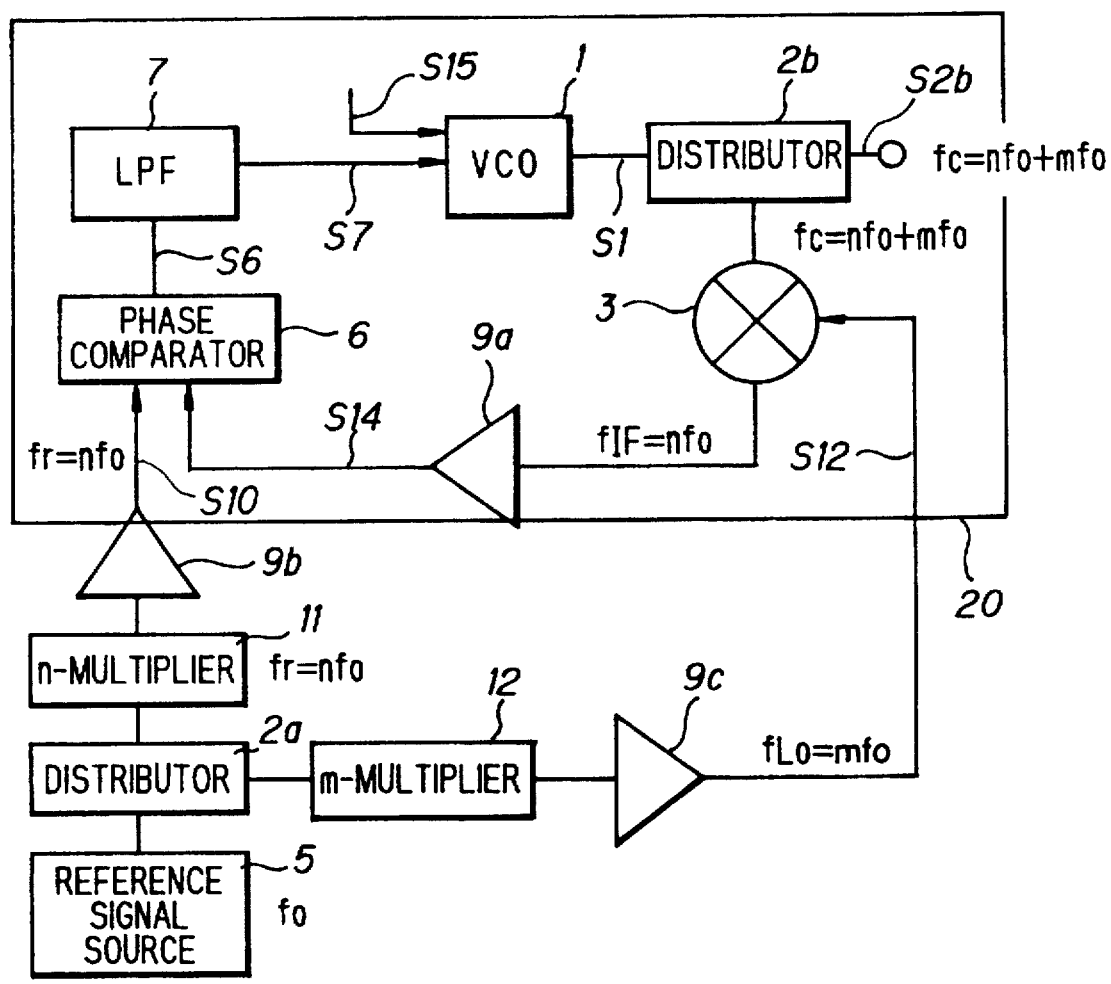
FIG. 4 is a block diagram showing a configuration of a phase-locked oscillator for microwave/millimeter-wave ranges in accordance with the second embodiment of the invention.

FIG. 4 is a structural view showing the second embodiment. In FIG. 4, the same components as used in FIG. 3 and FIGS. 1 and 2 are designated with the corresponding reference numerals. As shown in the figure, the second embodiment includes: a VCO 1; a distributor 2b; a frequency mixer 3; a microwave amplifier 9a ; a reference signal source 5; a distributor 2a; an n-multiplier 11; a microwave amplifier 9b ; an m-multiplying means (an m-multiplier 12 and a microwave amplifier 9c); a phase comparator 6; and an LPF 7.

Here, n-multiplier 11 as well as m-multiplier 12 and frequency mixer 3 has a band-pass filter in order to sufficiently inhibit unwanted higher harmonics, image signals, spurious signals. Microwave amplifiers 9a , 9b and 9c are gain-variable, linear, low-noise amplifiers which present narrow-band characteristics.

Hereinbelow, the operation of the second embodiment will be described. Here, it is assumed that the multiplying factor of n-multiplier 11 is 12, the multiplying factor of m-multiplier 12 is 18, and the frequency of the reference signal is 2 GHz. Microwave amplifiers 9a , 9b and 9c are assumed to be gain-variable, linear, low-noise amplifiers having narrow-band characteristics of 24±0.5 GHz, 24 ±0.5 GHz and 38±1 GHz, respectively.

The VCO 1 receives a phase-locking control signal s7 and a modulating signal s15 to output a high-frequency signal s1 having an oscillating frequency $f_c$ ($=nf_o+mf_o=60$ GHz), to distributor 2b. This distributor 2b separates the high-frequency signal s1 into two parts; one is outputted as an oscillator output signal s2b having a frequency $f_c$ ($=nf_o+mf_o=60$ GHz), the other is fed back to produce a phase-locking control signal s7.

The signal having a frequency $f_o(=2$ GHz) from reference signal source 5 is inputted into distributor 2a, whereby separated into two parts; one is inputted to m-multiplier 12 where the frequency of the input signal is multiplied by 18. The signal from m-multiplier 12 (having a frequency of $mf_o$ (=36 GHz)) is amplified by microwave amplifier 9c, and then is inputted as a locally oscillated signal s12 into the locally oscillated signal input terminal of frequency mixer 3 (frequency $fL_o=mf_o$). Thereafter, the signal is frequency-mixed with the signal (having a frequency $f_c$ ($=nf_o+mf_o=60$ GHz) from distributor 2b, and the resultant signal is amplified by microwave amplifier 9a to be outputted as intermediate frequency signal s14 having a frequency $f_{IF}$ ($=nf_o=24$ GHz), which is then inputted to phase comparator 6.

The other signal distributed from distributor 2a is inputted to n-multiplier 11 where the frequency of the input signal is multiplied by 12 (the resultant frequency $f_r=nf_o$ (24 GHz). The signal, then is amplified by microwave amplifier 9b to be outputted as a comparative signal s10, which in turn is inputted to phase comparator 6.

Phase comparator 6 compares the two signals s10 and s14 to output an error signal s6. This error signal s6 is processed through LPF 7 where unwanted signals are removed, to thereby produce a phase-locking control signal s7 to be inputted to VCO 1.

The thus configured loop 20, by feeding the output from VCO 1 back, reduces the error signal s6 to zero. As a result, even if VCO 1 outputs a high-frequency wave having an oscillating frequency $f_c$, which belongs to the millimeter-wave range, it is possible to stabilize the frequency so that the frequency stability and the phase-noise characteristic can be made close to those of reference signal source 5.

In the first embodiment, the oscillating frequency $f_c$ of VCO 1 and the frequency $f_o$ of the output from reference signal source 5 is associated by the relation: $f_c=2nf_o$, the oscillating frequency $f_c$ is required to be $2n$ times the frequency $f_o$ of the output from reference signal source 5. On the other hand, since, in the second embodiment, the oscillating frequency $f_c$ of VCO 1 and the frequency $f_o$ of the output from reference signal source 5 is connected by the relation: $f_c=(n+m)f_o$, it is possible to freely set the oscillating frequency $f_c$ of VCO 1, or the frequency of the oscillator output signal by varying n and m factors, although an increased number of parts are needed compared to that in the first embodiment.

(Third embodiment)

Figure 5:
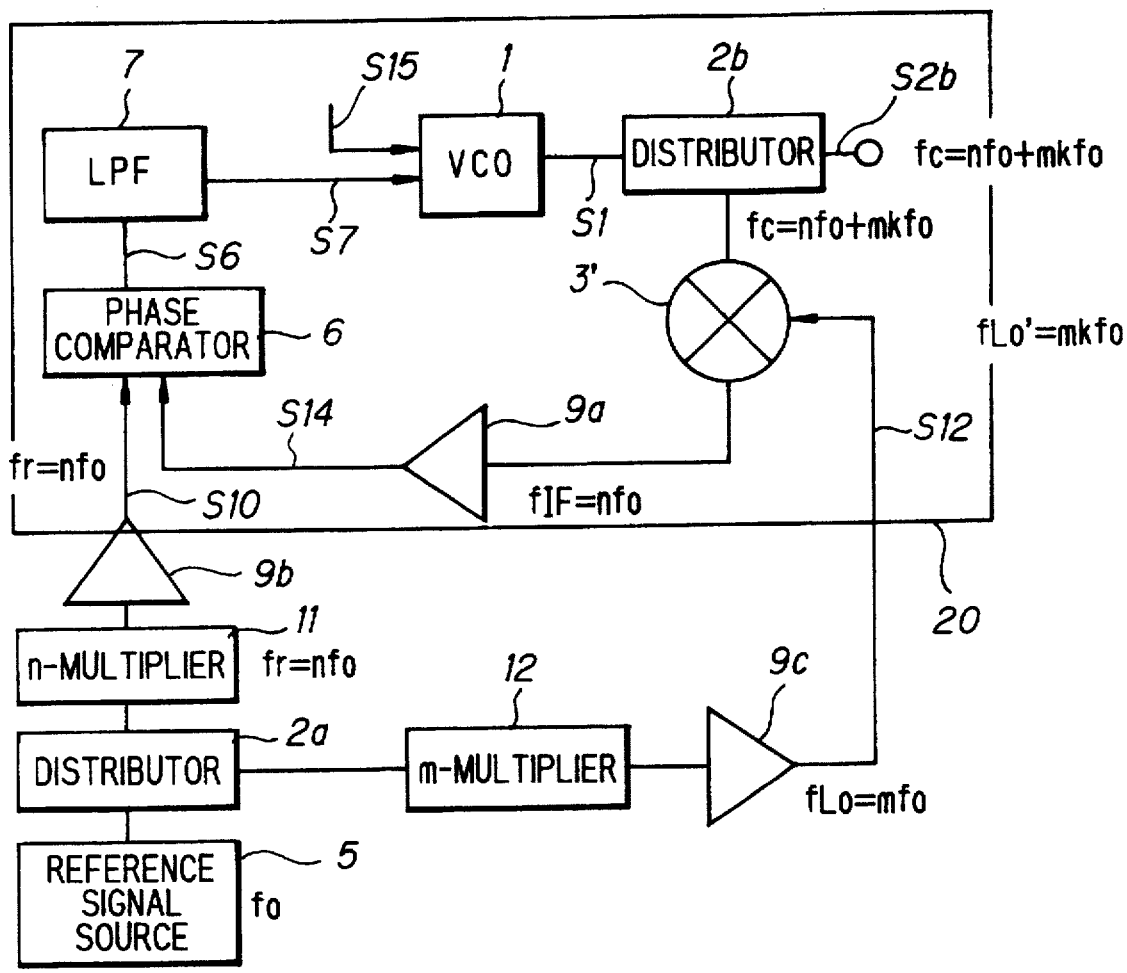
FIG. 5 is a block diagram showing a configuration of a phase-locked oscillator for microwave/millimeter-wave ranges in accordance with the third embodiment of the invention.

FIG. 5 is a block diagram showing the third embodiment.

This phase-locked oscillator for microwave/millimeter-wave ranges uses a k-th order harmonic mixer 3' in place of the frequency mixer 3 shown in FIG. 4. That is, a higher-harmonic mixing means is employed as the frequency mixing means. In the description of the operation of this circuit, which will hereinafter be described, the description of the same components as in the second embodiment will be omitted.

Here, since k-th order harmonic mixer 3' is used, locally oscillated signal s12 as the output from microwave amplifier 9c, can be converted into a k-th order locally oscillated signal (having a frequency of $mkf_o$) in the k-th order harmonic mixer 3'. As a result, the frequency of the output signal from m-multiplier 12 may be 1/k times that of the second embodiment.

Specifically, suppose that the oscillating frequency of VCO 1 is 60 GHz, the output frequency of the reference signal source 5 is 2 GHz, the multiplying factor 'n' of n-multiplier 11 is 12, and the value 'k' of k-th order harmonic mixer 3' is 6, the value 'm' of m-multiplier 12 can be set at 3 (in the case of the second embodiment, m was set at 18). Here, microwave amplifiers 9a, 9b and 9c can use gain-variable, linear, low-noise amplifiers, or the like having narrow-band characteristics of 24 ±0.5 GHz, 24±0.5 GHz and 38±1 GHz, respectively.

If the multiplying factor 'm' of m-multiplier 12 were large, the conversion loss in m-multiplier 12 would become large and therefore, the C/N ratio (carrier-to-noise ratio) characteristic as well as the phase-noise characteristic would be degraded greatly. As a result, the C/N characteristic and the phase-noise characteristic of intermediate frequency signal s14 would be degraded largely. In the third embodiment, since the k-th order harmonic wave mixer 3' is used, it is possible to reduce the multiplying factor 'm' of m-multiplier 12. This means the reduction of the conversion loss in the m-multiplier 12. Further, since the microwave amplifier 9c is interposed between m-multiplier 12 and k-th order harmonic mixer 3', it is possible to lower the conversion loss of the higher-harmonic mixer 3' and consequently, it is possible to improve the C/N characteristic and the phase-noise characteristic of the output signal from the higher-harmonic mixer 3'.

(Fourth embodiment)

Figure 6:
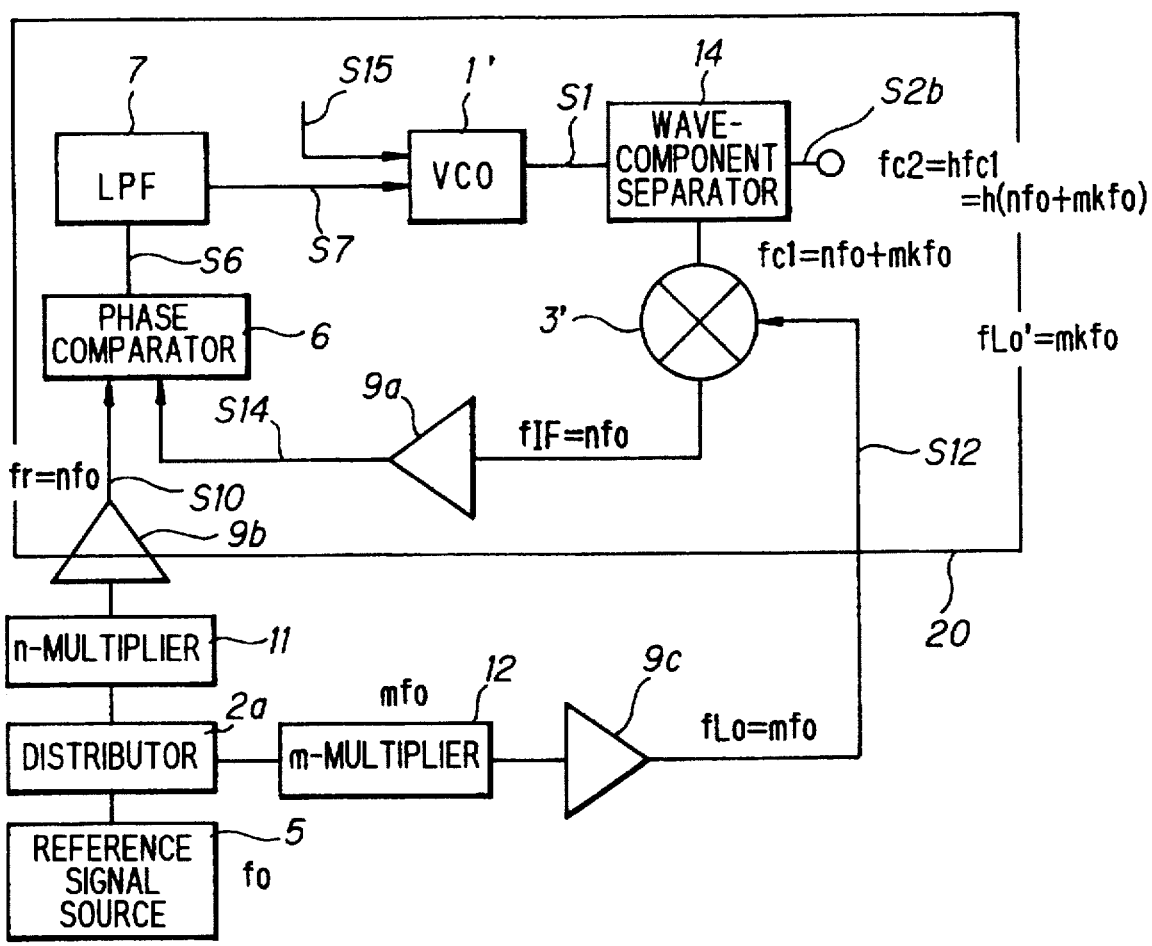
FIG. 6 is a block diagram showing a configuration of a phase-locked oscillator for microwave/millimeter-wave ranges in accordance with the fourth embodiment of the invention.

FIG. 6 is a block diagram showing the fourth embodiment.

In the fourth embodiment, a wave-component separating means (wave-component separator) 14 is used in place of distributor 2b in the phase-locked oscillator of FIG. 5. And a higher-harmonic oscillating means (microwave semiconductor VCO) 1' is used in place of the VCO 1.

Now, the operation of this phase-locked oscillator for microwave/millimeter-wave ranges will be described. In the description, the explanation of the same component as in FIG. 5 will be omitted.

In this case, the d.c. bias point for VCO 1' is set at a point within the non-linear operation range so that h-th order harmonic signal (h: a natural number) is generated. Then, the output from VCO 1' is inputted to wave-component separator 14 where the fundamental-wave signal of frequency $f_{c1}$ and h-th order harmonic signal of frequency $f_{c2}$ (=$hf_{c1}$) are separated. The fundamental-wave signal is used to produce a phase-locking control signal s7, while the h-th order harmonic signal is used as an oscillator output signal s2b.

Therefore, in order to obtain an oscillator output signal having the same frequency with that of any of the microwave/millimeter-wave range phase-locked generators shown in FIGS. 3 through 5, the fundamental oscillation frequency $f_{c1}$ of VCO 1' may be 1/h times that in the corresponding case of FIG. 3 through 5. In consequence, it is possible to reduce the multiplying factors 'n' and 'm' for n-multiplier 11 and m-multiplier 12 to 1/h.

Specifically, suppose that VCO 1' outputs a fundamental oscillating signal with a frequency of 30 GHz and a 2nd-order harmonic signal with an oscillating frequency of 60 GHz, the output frequency of the reference signal source 5 is 2 GHz, and the value 'k' of k-th order harmonic mixer 3' is 3, the multiplying factors for n-multiplier 11 and m-multiplier 12 may be set at 6 and 3, respectively. Here, microwave amplifiers 9a, 9b and 9c can use gain-variable, linear, low-noise amplifiers having narrow-band characteristics of 12±1 GHz, 12±1 GHz and 6±0.4 GHz, respectively.

If the multiplying factors 'n' and 'm' of n-multiplier 11 and m-multiplier 12 were large, the conversion losses in the multipliers would become large and therefore, the C/N ratio (carrier-to-noise ratio) characteristic as well as the phase-noise characteristic would be degraded greatly. As a result, the C/N characteristic and the phase-noise characteristic of the signal inside the feedback loop 20 would be degraded largely. In the fourth embodiment, since the multiplying factors 'n' and 'm' of the multipliers 11 and 12 can be reduced as stated above, it is possible to improve the C/N characteristic and the phase-noise characteristic of input signals s10 and s14 to phase comparator 6, and therefore the phase-noise characteristic inside feedback loop 20 can be reduced.

Further, it is possible to lower the operating frequencies of n-multiplier 11, m-multiplier 12, k-th order harmonic mixer 3', phase comparator 6, and microwave amplifiers 9a and 9b, and therefore the circuit configuration can be simplified.

The fourth embodiment is one in which VCO 1 and distributor 2b in the third embodiment are replaced with VCO 1' and wave-component separator 14, respectively. Analogically, when VCO 1 and distributor 2b in the first or second embodiment are replaced with the VCO 1' and wave-component separator 14, the same effect can, of course, be obtained.

In any of the first through fourth embodiments, if it is necessary to change the output frequency of VCO 1 or VCO 1' by a small frequency step $\Delta f_c$ (for example, 60 MHz) in order to set up a plurality of communication channels, the frequency $f_o$ of the frequency synthesizer used in reference signal source 5 can be varied.

The phase-locked oscillator of the invention can be used for a high-stability signal source as well as for the frequency modulator for the microwave/millimeter wave ranges.

As has been apparent from the description of the embodiments, according to the invention, the following advantages can be obtained.

First, in the phase-locked oscillator for microwave/millimeter-wave ranges according to the first configuration of the invention, the frequency of the reference signal is multiplied by 'n' in the n-multiplier to produce a comparative signal and a locally oscillated signal. The frequency mixer produces an intermediate frequency signal using the locally oscillated signal and a signal which has been distributed from the output from the high-frequency voltage-controlled oscillator by the distributor. Then the phase comparator compares the intermediate frequency signal with the comparative signal. In consequence, the frequency stability of the oscillator output signal from the oscillator can be improved to the same degree as that of the reference signal, whereby it is possible to inhibit phase-noise.

Next, in the phase-locked oscillator for microwave/ millimeter-wave ranges according to the second configuration of the invention, the n-multiplier produces a comparative signal from a signal which has been obtained by distributing the reference signal in two parts. The m-multiplier produces a locally generating signal from the other signal which has been distributed in two parts. Then, the frequency mixer produces an intermediate frequency signal using the locally oscillated signal and a signal which has been distributed from the output from the high-frequency voltage-controlled oscillator by the distributor. Then the phase comparator compares the intermediate frequency signal with the comparative signal. In consequence, the frequency stability as well as the phase-noise characteristic of the oscillator output signal from the oscillating means can be made close to those of the reference signal. Additionally, by changing the multiplying factors 'n' and 'm' of the n-multiplier and the m-multiplier, it is possible to vary the frequency of the output from the oscillating means. Accordingly, it is possible to increase the design flexibility of the frequency of the oscillator output signal.

Next, in the phase-locked oscillator for microwave/ millimeter-wave ranges according to the third configuration of the invention, the higher-harmonic mixer produces the k-th order harmonic of the locally oscillated signal. Therefore, it is possible to reduce the multiplying factor 'm' in the m-multiplier to 1/k times that of the second configuration. Accordingly, it is possible to lower the conversion loss in the m-multiplier. In this way, it is possible to improve the C/N ratio of the oscillator output signal and the phase-noise characteristic.

Further, the phase-locked oscillator for microwave/ millimeter-wave ranges according to any of the fourth through sixth configurations of the invention, includes a high-frequency voltage-controlled oscillator made up of a microwave semiconductor etc., for generating the h-th order harmonic, and a wave-component separator for separating the output from the oscillator into the fundamental wave signal and the h-th order harmonic. Accordingly, when the same oscillator output frequency with that in the phase-locked oscillator for microwave/millimeter-wave ranges of any one of the first through third configurations of the invention is to be obtained, it is possible to reduce the multiplying factors 'n' and 'm' of the n-multiplier and the m-multiplier to 1/h times those of the corresponding configuration. In consequence, it is possible to reduce the conversion losses in the n-multiplier and the m-multiplier, and thus it is possible to reduce the phase noise. Further, the operating frequencies of the other elements such as the frequency mixer, the phase comparator etc., can be lowered, so that it is possible to simplify the circuit configuration.

What is claimed is:

1. A phase-locked oscillator for microwave/millimeter-wave ranges comprising:

an oscillating means for producing a high-frequency signal based on a modulating signal and a phase-locking control signal;

a first distributing means for distributing the high-frequency signal into two parts and outputting one part of it as an oscillator output signal;

an n-multiplying means for multiplying the frequency of a reference signal by 'n';

a second distributing means for distributing the output from said n-multiplying means into two parts and outputting one part of it as a comparative signal and the other as a locally oscillated signal;

a frequency mixing means for producing an intermediate frequency signal using the other output from said first distributing means and the locally oscillated signal;

a phase comparing means for comparing the intermediate frequency signal and the comparative signal to output an error signal; and a low-pass filtering means for removing unwanted signals from the error signal to produce the phase-locking controlling signal.

2. A phase-locked oscillator for microwave/millimeter-wave ranges comprising:

an oscillating means for producing a high-frequency signal based on a modulating signal and a phase-locking control signal;

a first distributing means for distributing the high-frequency signal into two parts and outputting one part of it as an oscillator output signal;

a second distributing means for distributing a reference signal into two parts;

an n-multiplying means for multiplying the frequency of one output from said second distributing means by 'n' to produce a comparative signal;

an m-multiplying means for multiplying the frequency of the other output from said second distributing means by 'm' to produce a locally oscillated signal;

a frequency mixing means for producing an intermediate frequency signal using the other output from said first distributing means and the locally oscillated signal;

a phase comparing means for comparing the intermediate frequency signal and the comparative signal to output an error signal; and a low-pass filtering means for removing unwanted signals from the error signal to produce the phase-locking controlling signal.

3. A phase-locked oscillator for microwave/millimeter-wave ranges according to claim 2 wherein said frequency mixing means includes a higher-harmonic mixing means for generating a higher harmonic of the locally oscillated signal.

4. A phase-locked oscillator for microwave/millimeter-wave ranges according to claim 1 wherein said oscillating means includes a higher-harmonic oscillating means for generating a fundamental wave signal and a higher harmonic of the fundamental signal, and said first distributing means includes a wave-component separating means for separating the fundamental wave signal and the higher-harmonic signal from one another and outputting the higher-harmonic signal as the oscillator output signal.

5. A phase-locked oscillator for microwave/millimeter-wave ranges according to claim 2 wherein said oscillating means includes a higher-harmonic oscillating means for generating a fundamental wave signal and a higher harmonic of the fundamental signal, and said first distributing means includes a wave-component separating means for separating the fundamental wave signal and the higher-harmonic signal from one another and outputting the higher-harmonic signal as the oscillator output signal.

6. A phase-locked oscillator for microwave/millimeter-wave ranges according to claim 3 wherein said oscillating means includes a higher-harmonic oscillating means for generating a fundamental wave signal and a higher harmonic of the fundamental signal, and said first distributing means includes a wave-component separating means for separating the fundamental wave signal and the higher-harmonic signal from one another and outputting the higher-harmonic signal as the oscillator output signal.

* * * * *